(12) United States Patent
Blumschein et al.

(10) Patent No.: US 11,293,996 B2
(45) Date of Patent: Apr. 5, 2022

(54) METHOD AND DEVICE FOR GENERATING A CLASSIFICATION SIGNAL CLASSIFYING AN ELECTRICAL IMPEDANCE

(71) Applicant: Siemens Aktiengesellschaft, Munich (DE)

(72) Inventors: Joerg Blumschein, Berlin (DE); Yilmaz Yelgin, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/079,752

(22) Filed: Oct. 26, 2020

(65) Prior Publication Data

US 2021/0123984 A1    Apr. 29, 2021

(30) Foreign Application Priority Data

Oct. 25, 2019  (EP) .................................... 19205359

(51) Int. Cl.
  *H02H 3/00* (2006.01)
  *G01R 31/52* (2020.01)
  *H02H 1/00* (2006.01)

(52) U.S. Cl.
  CPC ............ *G01R 31/52* (2020.01); *H02H 1/0007* (2013.01); *H02H 3/00* (2013.01)

(58) Field of Classification Search
  None
  See application file for complete search history.

(56) References Cited

U.S. PATENT DOCUMENTS

| 6,104,182 | A | 8/2000 | Jurisch et al. | |
| 8,451,570 | B2 * | 5/2013 | Yelgin | H02H 1/04 361/80 |
| 8,736,297 | B2 * | 5/2014 | Yelgin | H02H 3/40 324/764.01 |
| 2013/0221977 | A1 * | 8/2013 | Ukil | G01R 31/08 324/522 |
| 2021/0011092 | A1 * | 1/2021 | Mizoguchi | B60L 3/0069 |

FOREIGN PATENT DOCUMENTS

| DE | 4100646 A1 | 9/1992 | |
| DE | 19746719 C1 | 5/1999 | |
| EP | 2304857 B1 | 9/2013 | |
| JP | H0476432 B2 * | 12/1992 | G01R 27/06 |

* cited by examiner

*Primary Examiner* — Stephen W Jackson
(74) *Attorney, Agent, or Firm* — Laurence A. Greenberg; Werner H. Stemer; Ralph E. Locher

(57) ABSTRACT

A method generates a classification signal classifying an electrical impedance. The time characteristic of the impedance is measured resulting in impedance values. Impedance change vectors whose direction describes the movement of the impedance in the complex impedance plane and whose length describes the amount of the respective impedance change are formed with temporally successive impedance values. A check is carried out to determine whether the impedance shows a directional, continuous impedance movement. In the event of a subsequently detected change of direction of the impedance movement, the reaching of a reversal point is inferred and the rotation of the impedance change vectors is monitored with the result of a formation of an angle of rotation measured value. A classification signal indicating a fault is generated if the impedance change vectors have rotated in the area of the reversal point through a predefined maximum angle of rotation.

17 Claims, 5 Drawing Sheets

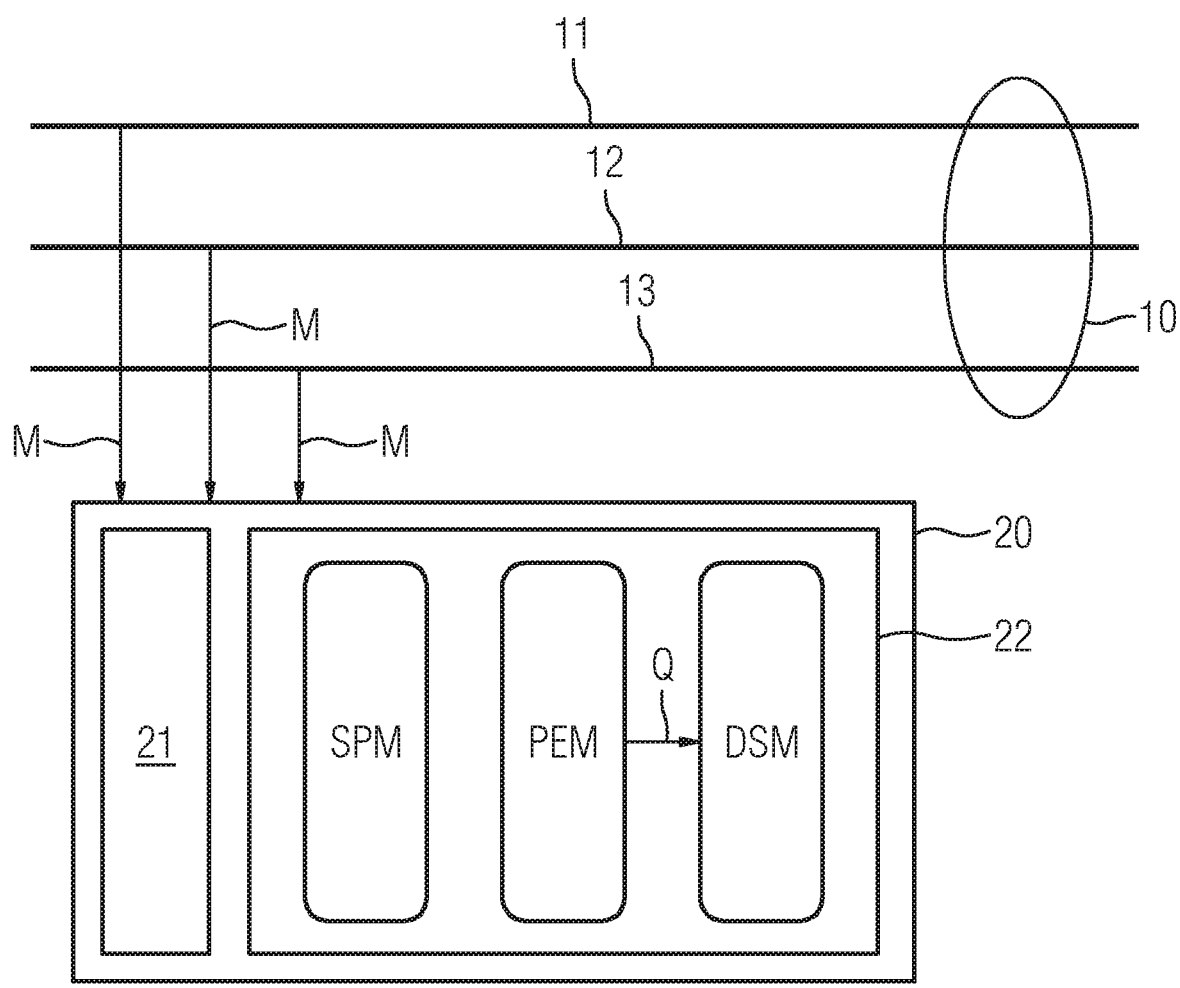

METHOD AND DEVICE FOR GENERATING A CLASSIFICATION SIGNAL CLASSIFYING AN ELECTRICAL IMPEDANCE

CROSS-REFERENCE TO RELATED APPLICATION

This application claims the priority, under 35 U.S.C. § 119, of European patent application EP 19 205 359, filed Oct. 25, 2019; the prior application is herewith incorporated by reference in its entirety.

BACKGROUND OF THE INVENTION

Field of the Invention

The invention belongs within the field of electrical engineering and relates, inter alia, to a method for generating a classification signal classifying an electrical impedance.

As is known, electrical lines and network sections can be monitored for a short circuit by measuring the impedances present on the lines. If it is determined that impedance values satisfy predefined tripping conditions, lying, for example, in the complex plane in defined tripping areas, a tripping signal is generated with which individual lines or line sections can be shut down. Monitoring of this type can be performed, for example, with distance protection devices such as those implemented, inter alia, in the SIPROTEC 7SA61 or SIPROTEC 7SA82/86/87 series of devices from Siemens AG.

It is also known that electrical impedances measured on electrical lines in electrical energy distribution networks or energy supply networks can change with time due to network fluctuations or unstable network situations, for example in the event of load fluctuations or abrupt changes in the feed-in situation, and their complex impedance values, considered in the complex plane, perform oscillation movements.

In the event of oscillation movements, it is disadvantageous if the aforementioned distance protection devices detect a fault and shut down lines or line sections without a short circuit which is to be shut down actually being present, since the already problematic network situation would be even further exacerbated and the instability of the network would be even further increased as a result.

It is therefore desirable to be able to block distance protection devices in the event of oscillation movements as long as no short circuit is present during the oscillation, and to unblock them once more when the oscillation movement has ended and or a short circuit could have occurred. A method for blocking and unblocking distance protection devices during oscillation movements is known, for example, from European patent document EP 2 304 857 B1.

BRIEF SUMMARY OF THE INVENTION

In view of the above problems, the object of the invention is to indicate a method and a device which enable a classification of impedance movements.

This object is achieved according to the invention with a method having the features as claimed in the independent patent claim. Advantageous designs of the method according to the invention are indicated in subclaims.

It is thus provided according to the invention that the time characteristic of an impedance is measured with the formation of impedance values, impedance change vectors whose direction describes the movement of the impedance in the complex impedance plane and whose length describes the amount of the respective impedance change are formed with temporally successive impedance values, a check is carried out on the basis of the impedance values and/or the impedance change vectors to determine whether the impedance shows a directional, continuous impedance movement according to at least one predefined movement criterion, in the event of a previously detected directional, continuous impedance movement and in the event of a subsequently detected change of direction of the impedance movement, the reaching of a reversal point is inferred and the rotation of the impedance change vectors is monitored in the area of the reversal point with formation of an angle of rotation measured value and a classification signal indicating a fault is generated if the impedance change vectors have rotated in the area of the reversal point through a predefined maximum angle of rotation or through more than the predefined maximum angle of rotation.

A significant advantage of the method according to the invention is that short circuits can be detected very quickly with the method in the area of reversal points in the event of oscillation movements. In the event of oscillation movements, oscillation segments in which the impedance values move directionally and continuously and reversal segments in which the movement direction rotates through approximately 180° alternate with one another. In the area of the reversal segments, the impedance values change very slowly in terms of amount. If a short circuit now occurs in the area of a reversal segment having a low amount of resistance, the short circuit will in some instances cause no significant change in the amount of the impedance, so that the end of the oscillation movement due to the short circuit is detected only when the time period customary for passing through a reversal segment (reversal point dwell phase) of approximately thirty network periods (i.e. 600 ms at a network frequency of 50 Hz) expires without change and no resumption of a directional, continuous impedance movement is determinable. In other words, considering the impedance amounts alone, a fault detection and, for example, an unblocking of a previously blocked distance protection device would be possible only on expiry of the time-period of approximately thirty network periods. The invention comes into play at this point by enabling a fault detection or an end of the normal oscillation movement already significantly before the expiry of the time-period with the consideration provided according to the invention of the impedance change vectors in the area of the reversal point and the monitoring of the rotation of the impedance change vectors. In other words, an unblocking of a distance protection device can, for example, be performed even temporally during the dwell phase in the area of the reversal point, i.e. long before the usual reversal point dwell phase of approximately thirty network periods has expired.

The classification signal indicating a fault is preferably regarded as a classification signal indicating an end of an oscillation movement, and previously performed blocking of protective devices is lifted, preferably in the presence of the classification signal indicating a fault or an end of an oscillation movement.

The predefined maximum angle of rotation preferably has a value between 240° and 310° and is, for example, 270°±5°.

The classification signal indicating a fault is preferably generated even if no resumption of the directional, continuous impedance movement according to the at least one predefined movement criterion is determined within a predefined time-period after the reversal point has been reached.

The predefined time-period is preferably between 20 and 40 network periods of the network frequency applied to the electrical impedance.

The angle of rotation measured value is preferably determined in each case by determining the angle between consecutive impedance change vectors with formation of an angle value, including impedance change vectors in the area of directional, continuous impedance movement in front of the reversal point and impedance change vectors behind the reversal point, and by determining angle differences between the consecutive angle values and by adding together the amounts of the angle differences and by further using the sum of the amounts of the angle differences as the angle of rotation measured value.

It is also advantageous if a classification signal indicating an oscillation movement is generated in the event of a detected directional, continuous impedance movement and the classification signal indicating the oscillation movement is maintained unless the impedance change vectors rotate beyond the predefined maximum angle of rotation in the area of the reversal point or no resumption of the directional, continuous impedance movement is determined within the predefined time period after the reversal point has been reached.

With regard to the reversal point detection, it is considered advantageous if the amounts of the real components of at least three consecutive impedance change vectors are added together with formation of a real component sum and the occurrence of a change of direction of the impedance movement and the reaching of a reversal point are inferred if the amount of the real component sum deviates beyond a predefined extent from the amount of the difference between the real component of the first impedance value used to form the real component sum and the real component of the last impedance value used to form the real component sum.

Alternatively or additionally, the occurrence of a change of angle of the impedance movement and the reaching of a reversal point can advantageously be inferred if the real components of two consecutive impedance vectors have different signs.

The predefined movement criterion applied to check whether the impedance reveals a directional, continuous impedance movement preferably contains checking whether the amount of the time derivative of the impedance values lies within a predefined time interval after the time.

Alternatively or additionally, it can advantageously be provided that the predefined movement criterion applied to check whether the impedance reveals a directional, continuous impedance movement contains checking whether the amount of the time derivative of the real component and/or the imaginary component of the impedance does or does not change beyond a predefined extent in the case of consecutive impedance values.

Alternatively or additionally, it can advantageously be provided that the predefined movement criterion applied to check whether the impedance reveals a directional, continuous impedance movement contains checking whether the angle difference between the impedance change vectors of temporally consecutive impedance vectors exceeds or falls below a predefined limit.

Alternatively or additionally, it can advantageously be provided that the predefined movement criterion applied to check whether the impedance reveals a directional, continuous impedance movement contains checking whether a simultaneous change in both the sign of the real component and the sign of the imaginary component has occurred in the case of temporally consecutive impedance change vectors.

The invention further relates to a method for controlling a protection device, in particular a distance protection device, which monitors a line to which the electrical impedance is connected. With regard to a method of this type, it is provided according to the invention that the protection device or at least a protection function of the protection device is controlled at least also through the use of a classification signal which has been generated as described above.

The protection device or at least a protection function of the protection device is preferably deactivated as-long-as the classification signal indicates an oscillation movement.

The protection device or at least a protection function of the protection device is preferably activated or a previous block is lifted if the classification signal indicates a fault, in particular an end of the oscillation movement.

The invention further relates to a device for generating a classification signal classifying an electrical impedance. With regard to a device of this type, it is provided according to the invention that the device is configured in such a way that, with temporally consecutive impedance values, it forms impedance change vectors whose direction describes the movement of the impedance in the complex impedance plane and whose length describes the amount of the respective impedance change, it checks on the basis of the impedance values and/or the impedance change vectors whether the impedance reveals a directional, continuous impedance movement according to at least one predefined movement criterion. In the event of a previously detected directional, continuous impedance movement and in the event of a subsequently detected change of direction of the impedance movement, it infers that a reversal point has been reached and monitors the rotation of the impedance change vectors in the area of the reversal point with formation of an angle of rotation measured value and generates a classification signal indicating a fault if the impedance change vectors have rotated in the area of the reversal point through a predefined maximum angle of rotation or through more than the predefined maximum angle of rotation.

With regard to the advantages of the device according to the invention and with regard to advantageous designs of the device according to the invention, reference is made to the descriptions given above in connection with the method according to the invention and its advantageous designs.

It is advantageous if the device is a protection device which contains a computing device and a memory.

An oscillation detection module and a distance protection module are preferably stored in the memory. During execution by the computing device, the oscillation detection module serves to generate the qualification signal which indicates the oscillation in the event of an oscillation movement and indicates a fault in the event that a predefined angle sum criterion is not satisfied. If a fault is indicated, a previous blocking of the distance protection module is preferably lifted during the oscillation movement.

Other features which are considered as characteristic for the invention are set forth in the appended claims.

Although the invention is illustrated and described herein as embodied in a method and a device for generating a classification signal classifying an electrical impedance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 7 is an illustration showing an arrangement with a three-phase electrical line to which a further example embodiment of a device according to the invention in the form of a protection device is connected.

DETAILED DESCRIPTION OF THE INVENTION

For the sake of clarity, the same reference numbers are always used in the figures for identical or comparable components.

Figure 1:
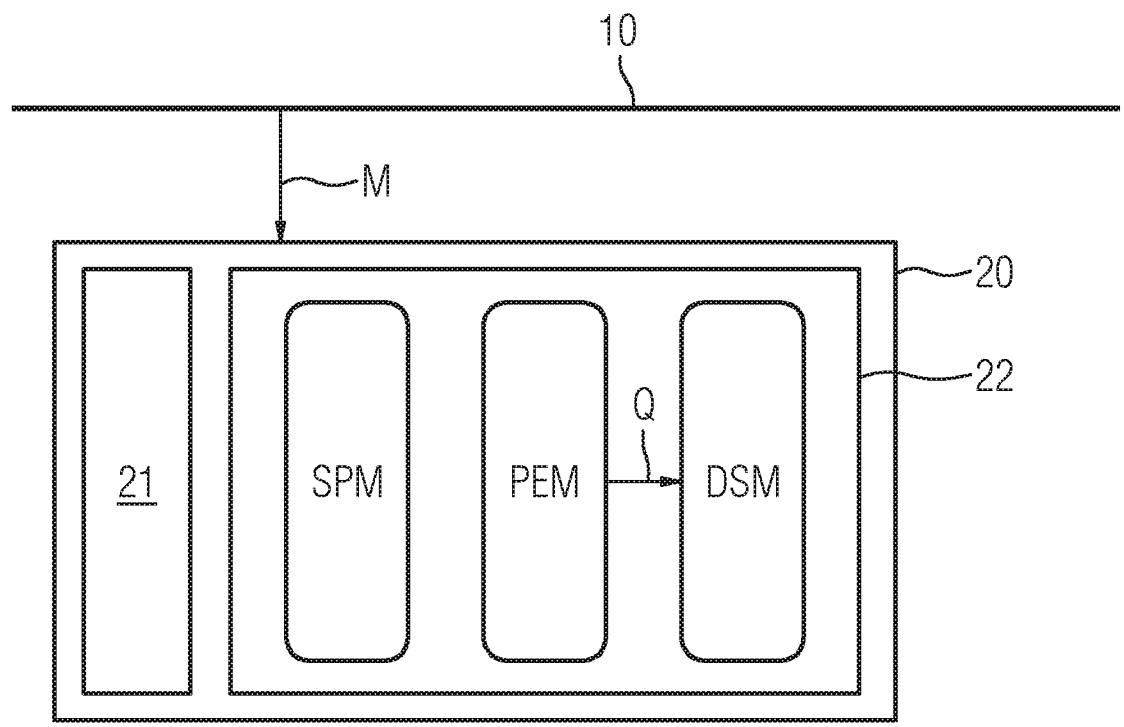
FIG. 1 is an illustration of an arrangement with an electrical line to which an example embodiment of a device according to the invention in the form of a protection device is connected, wherein the protection device is configured to implement an example embodiment of the method according to the invention.

Referring now to the figures of the drawings in detail and first, particularly to FIG. 1 thereof, there is shown an electrical line 10 to which an example embodiment of a device according to the invention in the form of a protection device 20 is connected. The protection device 20 contains a computing device 21 and a memory 22.

A control program module SPM for the higher-level mode of operation of the protection device 20, for example for the calculation of impedance values or impedance change vectors, an oscillation detection module PEM and a distance protection module DSM, inter alia, are stored in the memory 22.

During execution by the computing device 21, the oscillation detection module PEM serves to generate a qualification signal Q which indicates the oscillation in the event of an oscillation movement of an electrical impedance present on the line 10 and indicates a fault in the event that a predefined angle sum criterion is not satisfied.

During execution by the computing device 21, the distance protection module DSM forms a distance protection device. The distance protection module DSM is connected to the oscillation detection module PEM and is preferably blocked if a qualification signal indicating an oscillation is present so that the distance protection module DSM will not generate a tripping signal, irrespective of present impedance values. If the distance protection module DSM is unblocked, it can evaluate the impedance present on the line 10 in a known manner and, if necessary, can generate a tripping signal to shut down the line 10.

Measured values M are forwarded to the protection device 20. The measured values M may be impedance values which directly indicate the impedance on the electrical line 10; alternatively, they may be different measured values, such as, for example, current measured values or voltage measured values with which the protection device 20 itself forms impedance values.

The mode of operation of the oscillation detection module PEM and the distance protection module DSM according to FIG. 1 is explained in detail below by way of example with reference to a flow diagram (see FIG. 2).

In a checking step 100, it is first checked whether complex impedance values Z present on the input side change continuously or reveal a continuous movement in the complex plane. A continuous movement as opposed, for example, to an abrupt movement can be inferred if the amount of the difference between consecutive impedance values lies within a predefined reference interval, i.e., in other words, the amount of the time derivative of the impedance values lies within this predefined reference interval after the time.

If an impedance movement is not detected because, for example, the amount of the difference between consecutive impedance values Z is too small, a determination 101 is made that the impedance is not moving in the complex plane.

Conversely, if it is determined in the checking step 100 that the impedance is moving continuously, a determination 102 is made that a continuous impedance movement is taking place.

In a following checking step 110, it is checked whether the impedance is moving directionally and continuously. If the checking step 110 reveals a continuous, directional impedance movement, the determination 102 that the impedance is moving continues to apply. A qualification signal Q(P) which indicates an oscillation movement P of the impedance is further generated. The distance protection module DSM according to FIG. 1 is preferably blocked by the qualification signal Q(P).

Conversely, if it is determined in the checking step 110 that the impedance is not moving continuously and directionally, it is inferred that the impedance could be possibly be located at a reversal point of an oscillation movement. In this case, a determination 103 is made that the impedance is possibly located in the area of a reversal point.

In a following checking step 120, if the determination 103 applies, it is checked whether the impedance resumes a directional, continuous movement within a predefined time-period. If this is determined, the determination 102 is again made, according to which the impedance is moving. The qualification signal Q(P) which indicates an oscillation movement P of the impedance is further maintained.

Conversely, if it is determined in the checking step 120 that the impedance no longer changes significantly in terms of amount in the area of the reversal point, an angle sum check 130 is carried out in which the presence of a predefined angle sum criterion which will be explained in more detail below is checked.

If it is determined in the angle sum check 130 that the angle sum criterion is satisfied, the determination 103 that the impedance is located at the reversal point of an oscillation is again made. The qualification signal Q(P) which indicates an oscillation movement P of the impedance continues to be maintained.

Conversely, if it is determined in the angle sum check 130 that the predefined angle sum criterion is not satisfied, a qualification signal Q(F) which indicates a fault F, in particular an end of the oscillation movement, is generated.

If the qualification signal Q(F) which indicates a fault is present, the distance protection module DSM according to FIG. 1 is activated or the blocking of the distance protection module DSM is lifted so that the distance protection module DSM can then perform a distance protection check 140 and, if necessary, generate a tripping signal AS. The distance protection check 140 can be carried out, for example, in the manner known from the Wikipedia entry under "Protective relay" or from the SIPROTEC 7SA61 or SIPROTEC 7SA82/86/87 series of devices from Siemens AG.

Figure 3:
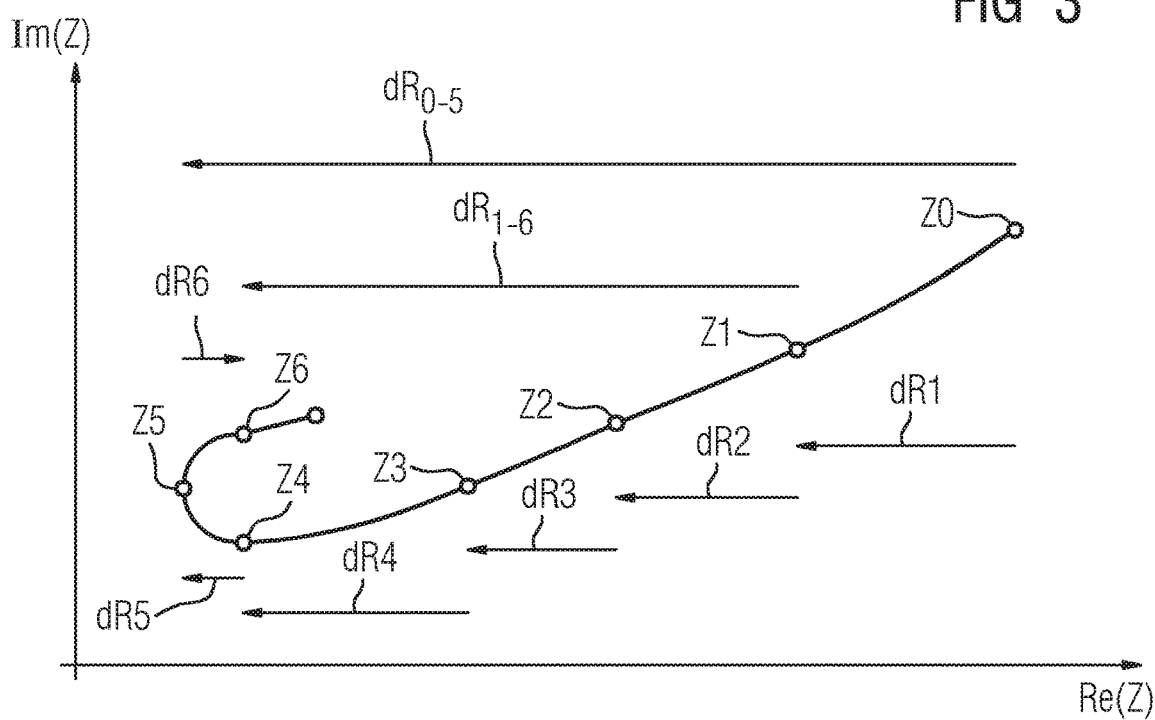
FIG. 3 is a graph showing an example embodiment of an advantageous check for the presence of a directional, continuous movement using the method according to FIG. 2.

FIG. 3 shows by way of example how the checking step 110 can be carried out to check for the presence of a directional, continuous movement. For this purpose, FIG. 3 shows impedance values Z0 to Z6 in the complex plane which have been measured in temporal succession.

It is evident that, in the case of the impedance values Z0 to Z5, the change in the real component dR1 to dR5 always has the same sign and a real component sum formed in terms of amount with the six impedance values Z0 to Z5 from the real component changes dR1, dR2, . . . , dR5 corresponds to the difference $DR_{0-5}$ between the real component of the first considered impedance value Z0 and the real component of the sixth considered impedance value Z5:

$$dR_{0-5} = \sum_{i=0}^{5} |dR_i|$$

In the case of the seventh impedance value Z6, the situation changes since the impedance movement shows a change of sign in respect of the real component and thus, for example, a real component sum formed in terms of amount with the six impedance values Z1 to Z6 no longer corresponds exactly to the difference between the real component of the first considered impedance value Z1 and the real component of the seventh considered impedance value Z6, but instead deviates from it:

$$dR_{1-6} \neq \sum_{i=1}^{6} |dR_i| \text{ or}$$

$$ABW = \left| dR_{1-6} - \sum_{i=1}^{6} |dR_i| \right| \neq 0$$

If the deviation ABW exceeds a predefined amount, the occurrence of a change of direction of the impedance movement and the reaching of a reversal point are inferred.

Figure 2:
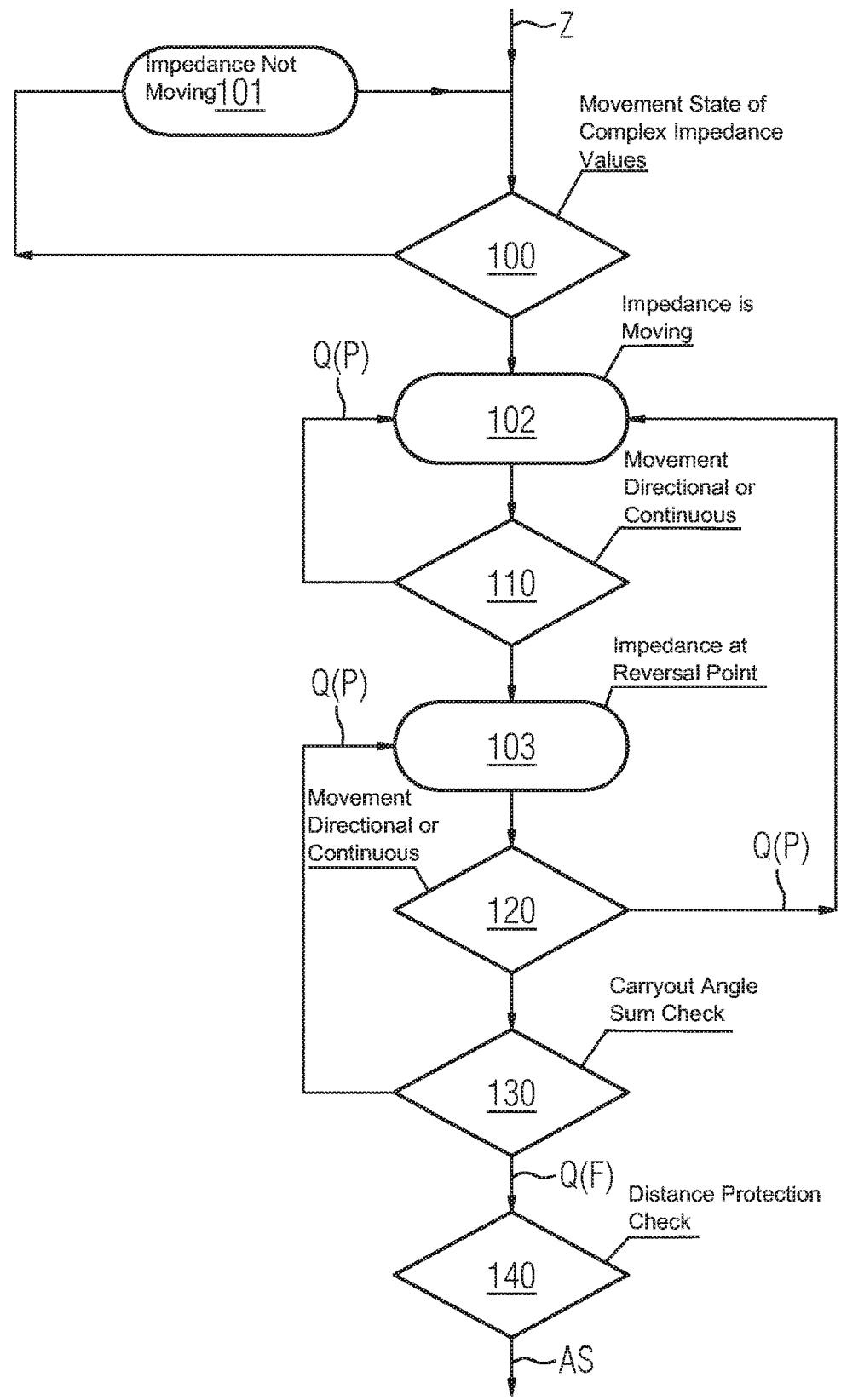
FIG. 2 is a flow chart showing an example embodiment of a method according to the invention.
Figure 4:
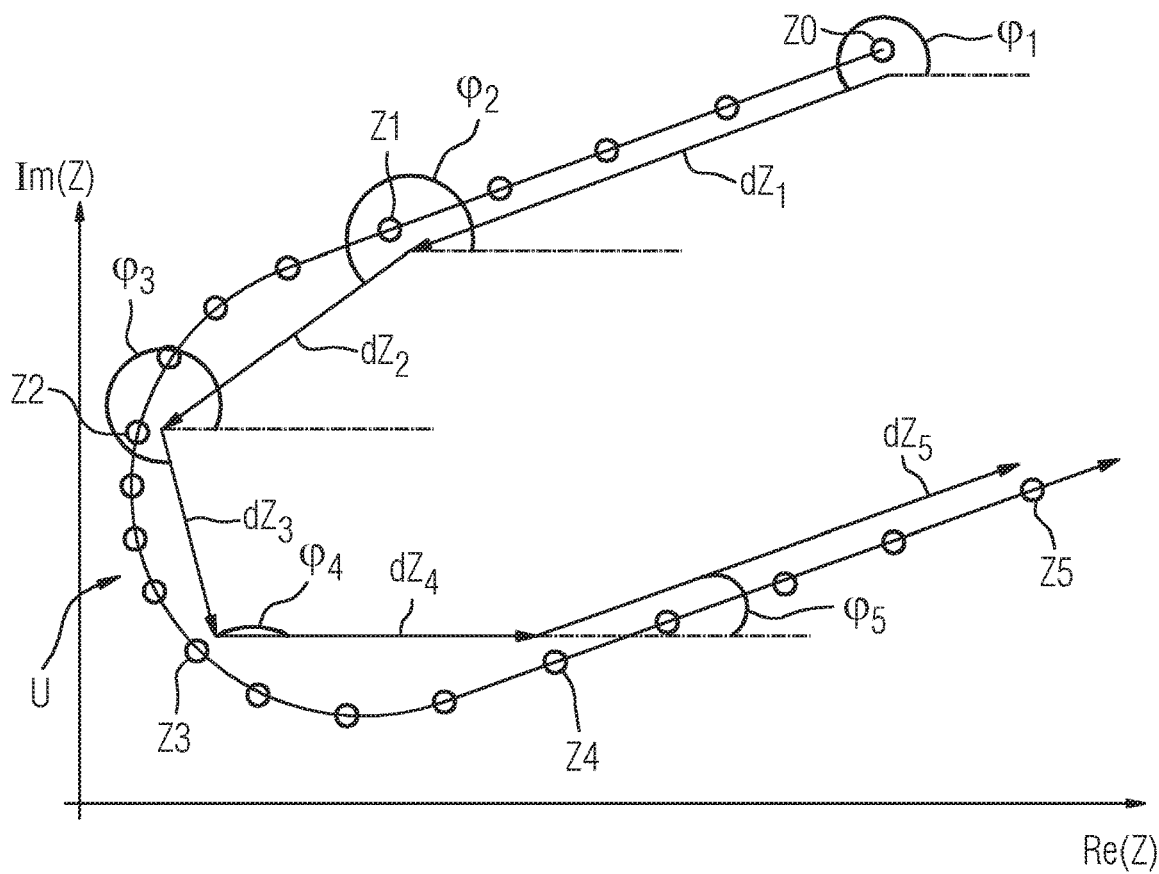
FIG. 4 is a graph showing an example embodiment of an advantageous angle check using the method according to FIG. 2.

FIG. 4 shows by way of example how the angle sum check 130 according to FIG. 2 can be carried out. For this purpose, FIG. 4 shows an impedance characteristic in the complex plane in the vicinity of a reversal point U at which the impedance values Z hardly move.

If the cessation of the impedance movement is detected in checking step 120, a start is made in the angle sum check 130 to calculate an angle sum φs which quantitatively describes the rotation of the impedance change vectors dZ1 in the area of the reversal point to dZ5 and which can also be referred to accordingly as the angle of rotation measured value:

φs=|φ2−φ1|+|φ3−φ2|+|φ4−φ3|+|φ5−φ4|

φs=|−140°−(−160°)|+|−70°−(−140°)|+|0°−(−70°)|+ |40°−(0°)|=200°

The checking of the angle sum or the angle of rotation measured value φs is performed while the impedance characteristic is located in the vicinity of the reversal point U and the impedance does not continue to move significantly. During a synchronous oscillation, the impedance characteristic ideally has a 180° rotation and then resumes a directional, continuous movement, as shown by way of example in FIG. 4. In this case, the angle of rotation measured value φs will not significantly exceed a value of approximately 180.

As long as a time span of, for example, 30 network periods typical for passing through a reversal point U during an oscillation has therefore not yet expired and the angle sum φs has not yet significantly exceeded a value of approximately 180, it is further assumed in the angle sum check 130 that an oscillation may be present and the angle sum criterion is regarded as satisfied.

Conversely, if a short circuit occurs in the area of the reversal point U, the impedance change vectors will, from experience, continue to rotate in the area of the reversal point U and will reach or exceed a predefined maximum angle of rotation of, for example, 270°.

The angle sum criterion will accordingly no longer be regarded as satisfied in the angle sum check 130 as soon as the impedance change vectors have reached the predefined maximum angle of rotation of, for example, 270° in the area of the reversal point.

The angle sum criterion will also no longer be regarded as satisfied as soon as the time period of, for example, 30 network periods typical for passing through a reversal point U during an oscillation has expired without result, i.e. no resumption of a directional, continuous movement of the impedance values has been determined after reaching the reversal point U.

The advantage of the described checking of two subcriteria, i.e. the resumption of a directional, continuous movement within a time period of, for example, 30 network periods typical for oscillations in combination with the additional angle check, advantageously enables the very fast unblocking of the distance protection module DSM even before the expiry of the time period typical for oscillations if the angle check indicates a fault.

A measurement window of at least two network periods is preferably used for the calculation of the angle sum φs in order to smooth out outliers in the impedance calculation.

Figure 5:
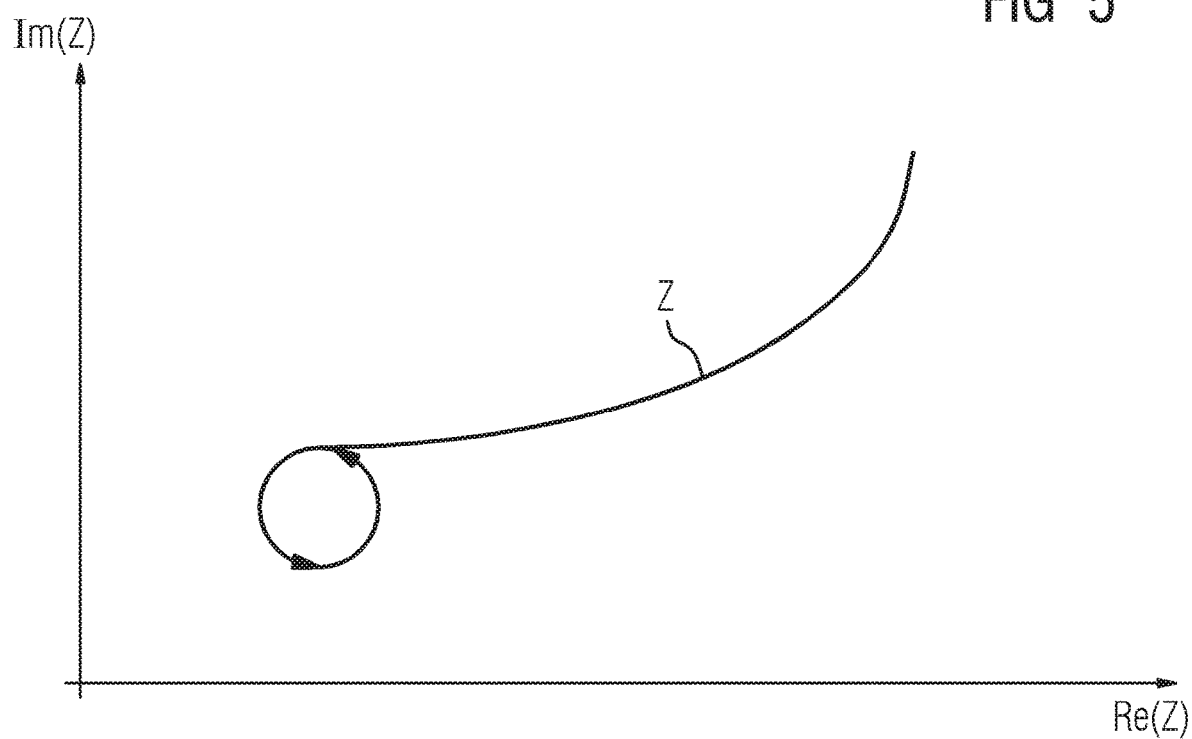
FIG. 5 is a graph showing an example of an impedance characteristic in the event of a short circuit in the area of a reversal point of an oscillation movement.

FIG. 5 shows a typical impedance characteristic of impedance values Z when a short circuit occurs in the area of a reversal point U during an oscillation movement. It is evident that the impedance vectors turn in on themselves and exceed the maximum angle of rotation. As soon as this is detected by means of the angle sum criterion, the blocking of the distance protection module DSM according to FIG. 1 can be lifted and a distance protection check can be carried out by the distance protection module DSM.

Figure 6:
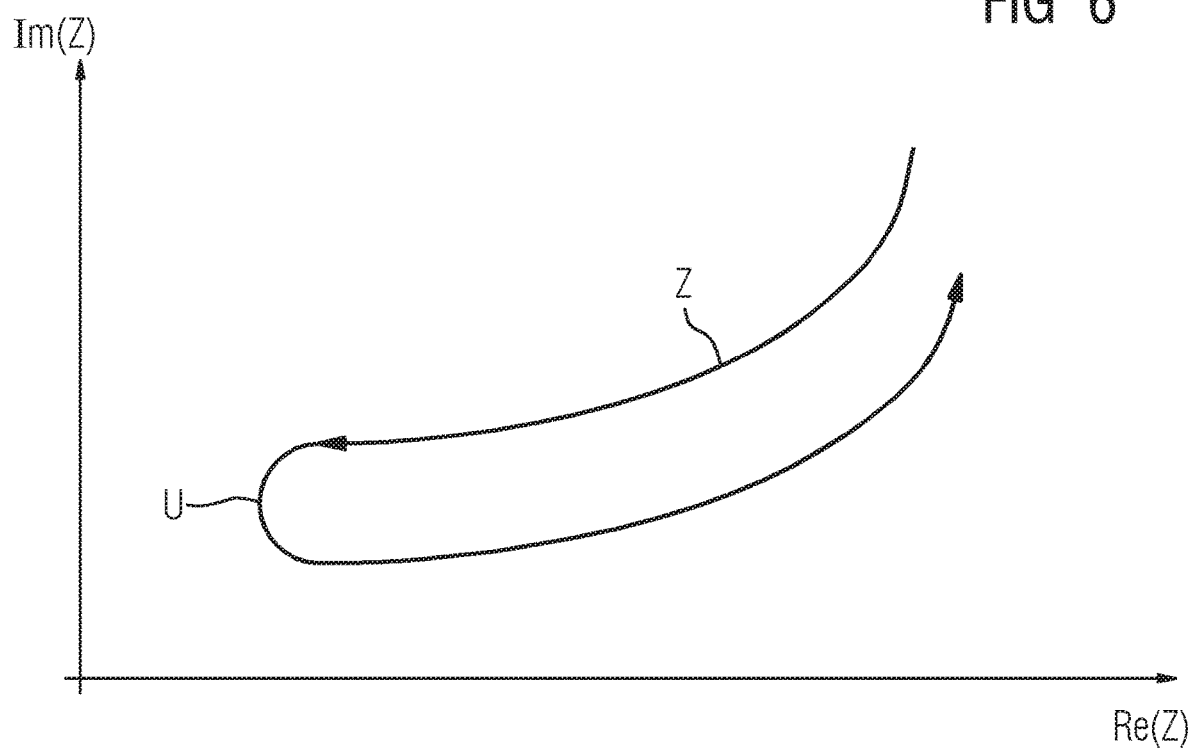
FIG. 6 is a graph showing an example of an impedance characteristic in the event of an oscillation movement without a short circuit in the area of the reversal point.

FIG. 6 shows a typical impedance characteristic of impedance values Z without the occurrence of a short circuit in the area of a reversal point U during an oscillation movement. It is evident that the impedance values resume a directional, continuous movement following a rotation of approximately 180°. If this happens within the typical time period of, for example, 30 network periods, the blocking of the distance protection module DSM according to FIG. 1 is preferably lifted.

FIG. 7 shows a three-phase electrical line 10 to whose phase conductors 11, 12 and 13 a protection device 20 is connected. The protection device 20 contains a computing device 21 and a memory 22 in which an oscillation detection module PEM and a distance protection module DSM, inter alia, are stored. The protection device 20 preferably works in relation to each of the phase conductors 11, 12 and 13 in each case in the manner explained in connection with FIG. 1 on the basis of a single-phase line 10.

Although the invention has been illustrated and described in greater detail by means of preferred example embodiments, the invention is not limited by the disclosed examples and other variations may be derived therefrom by the person skilled in the art without departing the protective scope of the invention.

The following is a summary list of reference numerals and the corresponding structure used in the above description of the invention:

10 Electrical line
11 Phase conductor
12 Phase conductor
13 Phase conductor
20 Protection device
21 Computing device
22 Memory
100 Checking step
101 Determination
102 Determination
103 Determination
110 Checking step
120 Checking step
130 Angle sum check
140 Distance protection check
ABW Deviation
AS Tripping signal
dR1-dR6 Real component
dZ1-dZ5 Impedance change vectors
$DR_{0-5}$ Differential value
DSM Distance protection module
F Fault
M Measured values
P Oscillation movement
PEM Oscillation detection module
Q Qualification signal
Q(F) Qualification signal
Q(P) Qualification signal
SPM Control program module
U Reversal point
Z Impedance values
Z0-Z6 Impedance values
$\varphi 1$-$\varphi 5$ Angle value
$\varphi s$ Angle sum/angle of rotation measured value

The invention claimed is:

1. A method for generating a classification signal classifying an electrical impedance, which comprises the steps of:
    measuring a time characteristic of the electrical impedance resulting in a formation of impedance values;
    forming impedance change vectors whose direction describes a movement of the electrical impedance in a complex impedance plane and whose length describes an amount of a respective impedance change with temporally successive impedance values of the impedance values;
    carrying out a check on a basis of the impedance values and/or the impedance change vectors to determine whether the electrical impedance shows a directional, continuous impedance movement according to at least one predefined movement criterion;
    inferring a reaching of a reversal point in an event of a previously detected directional, continuous impedance movement and in an event of a subsequently detected change of direction of the impedance movement;
    monitoring a rotation of the impedance change vectors in an area of the reversal point resulting in a formation of an angle of rotation measured value; and
    generating the classification signal indicating a fault if the impedance change vectors have rotated in an area of the reversal point through a predefined maximum angle of rotation or through more than the predefined maximum angle of rotation.

2. The method according to claim 1, wherein the predefined maximum angle of rotation has a value between 240° and 310°.

3. The method according to claim 1, which further comprises generating the classification signal indicating the fault even if no resumption of the directional, continuous impedance movement according to the at least one predefined movement criterion is determined within a predefined time period after the reversal point has been reached.

4. The method according to claim 3, wherein the predefined time period is between 20 and 40 network periods of a network frequency applied to the electrical impedance.

5. The method according to claim 1, which further comprises:
    determining the angle of rotation measured value by determining an angle in each case between consecutive impedance change vectors resulting in a formation of an angle value, including impedance change vectors in an area of the directional, continuous impedance movement in front of the reversal point and the impedance change vectors behind the reversal point; and
    determining angle differences between consecutive angle values and adding together amounts of the angle differences and further using a sum of the amounts of the angle differences as an angle of rotation measured value.

6. The method according to claim 1, which further comprises generating the classification signal indicating an oscillation movement in an event of a detected directional, continuous impedance movement, and the classification signal indicating the oscillation movement is maintained unless the impedance change vectors rotate beyond the predefined maximum angle of rotation in the area of the reversal point or no resumption of the directional, continuous impedance movement is determined within a predefined time period after the reversal point has been reached.

7. The method according to claim 5, which further comprises:
    adding together amounts of real components of at least 3 of the consecutive impedance change vectors resulting in a formation of a real component sum; and
    inferring an occurrence of a change of direction of the impedance movement and a reaching the reversal point if an amount of the real component sum deviates beyond a predefined extent from an amount of a difference between the real component of a first impedance value used to form the real component sum and the real component of a last impedance value used to form the real component sum.

8. The method according to claim 7, wherein the occurrence of the change of angle of the impedance movement and a reaching of the reversal point can advantageously be inferred if the real components of two said consecutive impedance change vectors have different signs.

9. The method according to claim 1, wherein the at least one predefined movement criterion applied to check whether the electrical impedance reveals the directional, continuous impedance movement includes checking whether an amount of a time derivative of the impedance values lies within a predefined time interval after a time.

10. The method according to claim 1, wherein the at least one predefined movement criterion applied to check whether the electrical impedance reveals the directional, continuous impedance movement includes checking whether an amount of a time derivative of a real component and/or an imaginary component of the electrical impedance does or does not change beyond a predefined extent in a case of consecutive said impedance values.

11. The method according to claim 1, wherein:
the at least one predefined movement criterion applied to check whether the electrical impedance reveals the directional, continuous impedance movement includes checking whether an angle difference between the impedance change vectors of temporally consecutive said impedance vectors exceeds or falls below a predefined limit; and/or
the at least one predefined movement criterion applied to check whether the electrical impedance reveals the directional, continuous impedance movement includes checking whether a simultaneous change in both a sign of a real component and a sign of an imaginary component has occurred in a case of temporally consecutive said impedance change vectors.

12. The method according to claim 2, wherein the predefined maximum angle of rotation has a value of 270°±5°.

13. A method for controlling a protection device, which comprises the step of:
controlling the protection device or at least a protection function of the protection device at least through a use of a classification signal which has been generated according to claim 1.

14. The method according to claim 13, wherein the protection device or the protection function of the protection device is deactivated as long as the classification signal indicates an oscillation movement.

15. The method according to claim 13, wherein the protection device or the protection function of the protection device is deactivated if the classification signal indicates a fault.

16. The method according to claim 13, wherein the protection device is a distance protection device which monitors a line to which the electrical impedance is connected.

17. A device for generating a classification signal classifying an electrical impedance, the device being configured to:
form impedance change vectors whose direction describes a movement of the electrical impedance in a complex impedance plane and whose length describes an amount of a respective impedance change with temporally consecutive impedance values;
check on a basis of the impedance values and/or the impedance change vectors whether the electrical impedance shows a directional, continuous impedance movement according to at least one predefined movement criterion;
in an event of a previously detected said directional, continuous impedance movement and in an event of a subsequently detected change of direction of the impedance movement, it infers that a reversal point has been reached and monitors a rotation of the impedance change vectors in an area of the reversal point resulting in a formation of an angle of rotation measured value; and
generate the classification signal indicating a fault if the impedance change vectors have rotated in the area of the reversal point through a predefined maximum angle of rotation or through more than the predefined maximum angle of rotation.

* * * * *